United States Patent [19]
Roberts et al.

[11] Patent Number: 5,789,306
[45] Date of Patent: Aug. 4, 1998

[54] DUAL-MASKED FIELD ISOLATION

[75] Inventors: Ceredig Roberts; Werner Juengling, both of Boise, Id.

[73] Assignee: Micron Technology, Inc., Boise, Id.

[21] Appl. No.: 634,421

[22] Filed: Apr. 18, 1996

[51] Int. Cl.⁶ .................................................. H01L 21/76
[52] U.S. Cl. ........................................................ 438/452
[58] Field of Search ............... 437/69, 70; 148/DIG. 85, 148/DIG. 86, DIG. 117; 438/452, 229

[56] References Cited

U.S. PATENT DOCUMENTS

| | | |
|---|---|---|
| 4,551,910 | 11/1985 | Patterson . |
| 4,959,325 | 9/1990 | Lee et al. . |
| 5,057,449 | 10/1991 | Lowrey et al. . |
| 5,128,274 | 7/1992 | Yabu et al. . |
| 5,252,504 | 10/1993 | Lowrey et al. . |
| 5,260,229 | 11/1993 | Hodges et al. . |
| 5,358,894 | 10/1994 | Fazan et al. . |
| 5,466,632 | 11/1995 | Lur et al. . |
| 5,468,675 | 11/1995 | Kaigawa ................................ 437/69 |

FOREIGN PATENT DOCUMENTS

| | | |
|---|---|---|
| 53-148389 | 12/1978 | Japan . |
| 60-167349 | 8/1985 | Japan . |
| 1-100948 | 4/1989 | Japan . |
| 2-219253 | 8/1990 | Japan . |
| 4-130630 | 5/1992 | Japan . |
| 4-162528 | 6/1992 | Japan . |

OTHER PUBLICATIONS

J.W. Lutze, A.H. Perera, and J.P. Krusius; Field Oxide Thinning in Poly Buffer LOCOS Isolation with Active Area Spacings to 0.1; Jun. 1990; vol. 137, No. 6.

*Primary Examiner*—George R. Fourson
*Attorney, Agent, or Firm*—Knobbe, Martens, Olson & Bear, LLP

[57] ABSTRACT

A field isolation process utilizes two or more isolation formation steps to form active areas on a semiconductor substrate. Each field isolation step forms a portion of the field isolation in a manner which reduces field oxide encroachment, in particular, by forming field oxide islands. The superposition of field isolation configurations define the desired active areas. A presently preferred dual-mask process may be carried out using a single masking stack, or more preferably using a masking stack for each isolation mask. The present isolation process further allows isolation features to be optimized for a variety of isolation requirements on the same integrated circuit.

8 Claims, 15 Drawing Sheets

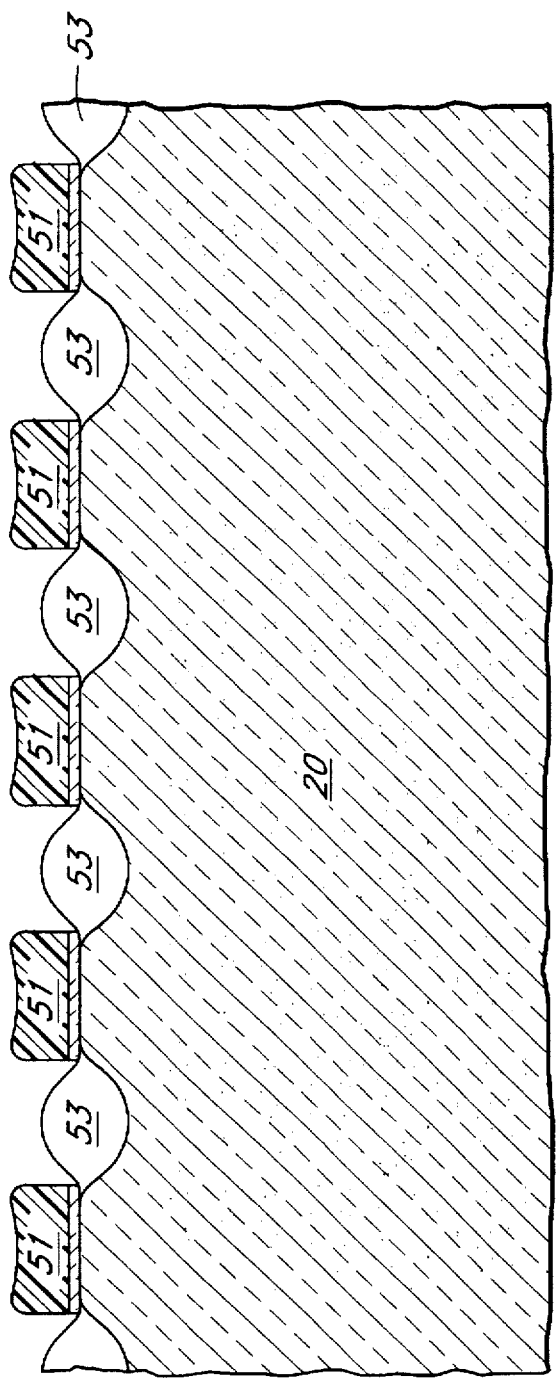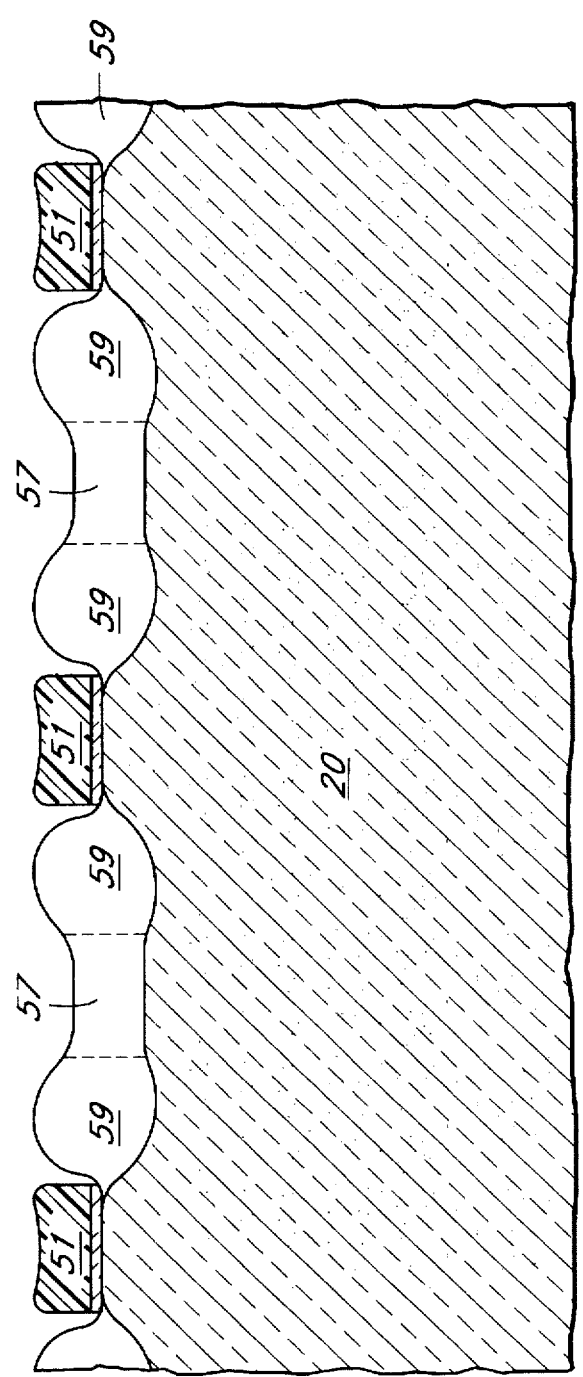
Fig. 4A
Fig. 5A

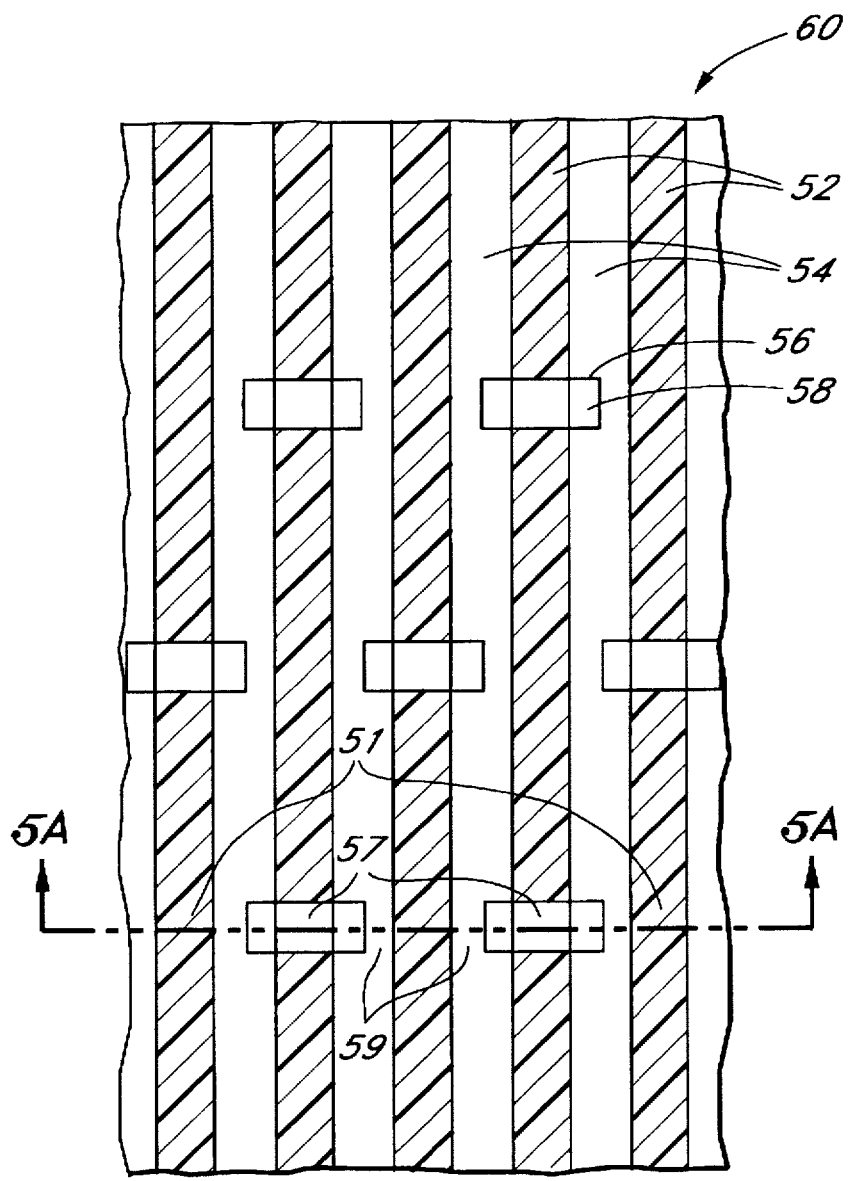

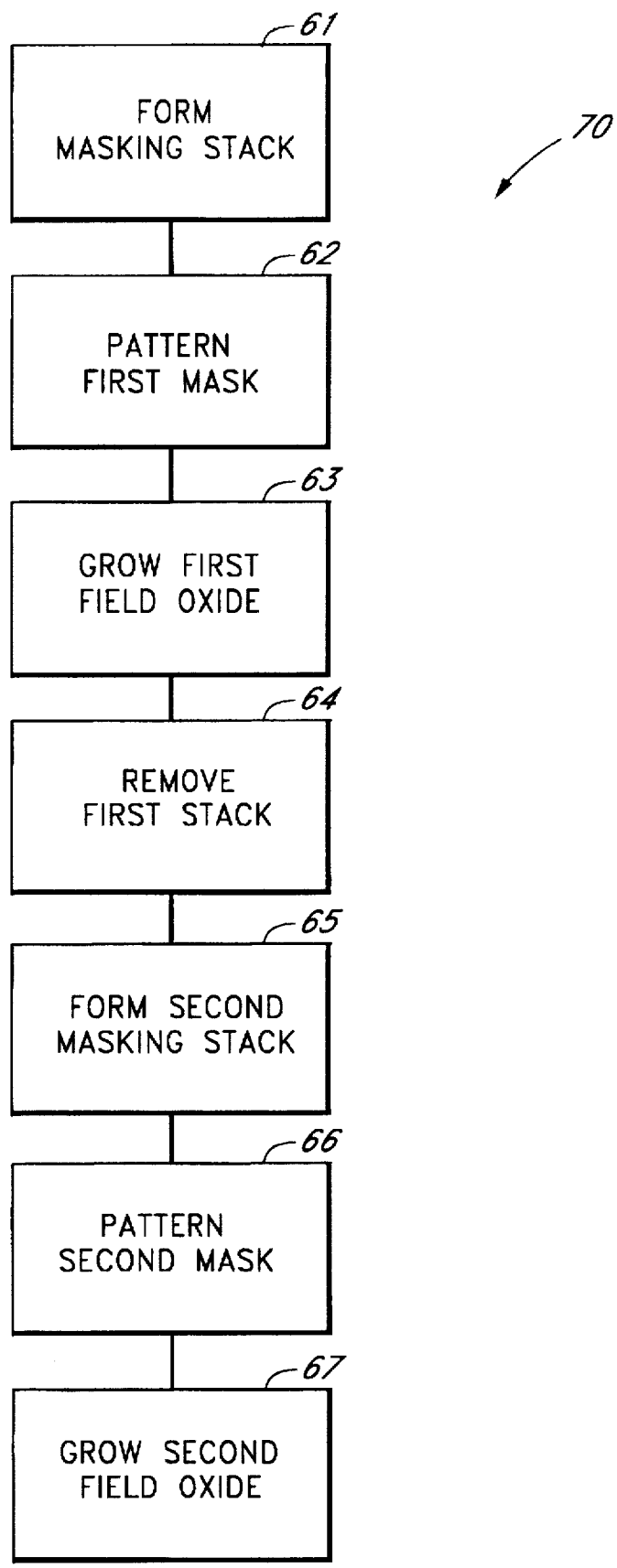

DUAL-MASKED FIELD ISOLATION

FIELD OF THE INVENTION

The invention relates generally to silicon integrated circuit process technology. In particular, the invention pertains to field isolation process technology such as found in LOCal Oxidation of Silicon (LOCOS).

BACKGROUND OF THE INVENTION

Implementing electronic circuits involves connecting isolated devices through specific electronic paths. In silicon integrated circuit fabrication it is necessary to isolate devices, which are built into the same silicon matrix, from one another. They are subsequently interconnected to create the desired circuit configuration. In the continuing trend toward higher device densities, parasitic inter-device currents become more problematic. Isolation technology has thus become one of the most critical aspects of contemporary integrated circuit fabrication.

Over the last few decades a variety of successful isolation technologies have been developed to address the requirements of different integrated circuit devices, such as NMOS, CMOS and bipolar. In general, the various isolation technologies exhibit different attributes with respect to such characteristics as minimum isolation spacing, surface planarity, process complexity and the defect density generated during isolation processing. Moreover, it is common to trade off some of these characteristics when developing an isolation process for a particular integrated circuit application.

In metal-oxide-semiconductor (MOS) technology it is necessary to provide an isolation structure that prevents parasitic channel formation between adjacent devices, such devices being primarily NMOS or PMOS transistors or CMOS circuits. The most widely used isolation technology for MOS circuits has been that of LOCOS isolation, an acronym for LOCal Oxidation of Silicon. LOCOS isolation essentially involves the growth of recessed or semirecessed silicon dioxide ($SiO_2$ or oxide) in unmasked nonactive or field regions of the silicon substrate, producing the so-called field oxide (FOX). The masked regions of the substrate generally define active areas (AA) within which devices are subsequently fabricated. The FOX is generally grown thick enough to lower any parasitic capacitance occurring over these regions, but not so thick as to cause step coverage problems. The great success of LOCOS isolation technology is to a large extent attributed to its inherent simplicity in MOS process integration, cost effectiveness and adaptability.

An exemplary prior art LOCOS isolation process is illustrated in FIGS. 1-2. As shown in FIG. 1, a silicon substrate 20 is typically masked by a so-called masking stack 26 comprising a pad-oxide layer 22 and a masking nitride layer 24 ($Si_3N_4$). The masking stack 26 is typically patterned by conventional photolithographic means and etched to expose selected regions of the silicon substrate 20 for FOX growth. As shown in FIG. 2, an exemplary active area array 30 is defined and protected from oxide growth by the patterned masking stack segments 32. Field isolation of the active areas is achieved by growing FOX in the unmasked portions of the silicon substrate. After FOX growth, the masking stack segments 32 are removed and devices are fabricated within the active areas.

In spite of its success, several limitations of LOCOS technology have driven the development of improved or alternative isolation structures. As further shown in FIG. 2, active area features 36, defined by the resulting FOX growth, often differ from the intended structure 38 because of nonideal effects present in conventional LOCOS processing. For example, light diffraction and interference around photolithographic mask edges during the patterning process typically produces rounding at mask corners, an effect which is exacerbated in small features such as found in DRAM active area arrays 30. Additionally, isolated, narrow photolithographic features such as shown here are often susceptible to lifting and nonuniformities due to mask misalignment.

A major limitation in LOCOS isolation is that of oxide undergrowth or encroachment at the edge of the masking stack which defines the active regions of the substrate. This so-called bird's beak (as it appears) poses a serious limitation to device density, since that portion of the oxide adversely influences device performance while not significantly contributing to device isolation. Furthermore, as IC device density increases, the undesirable effects of bird's beak growth become particularly problematic for active area features in the sub half-micron regime. The bird's beak encroachment becomes particularly severe at narrow, terminating features 38 as shown in FIG. 2. A cross-section 2A—2A of the FOX structure, shown in FIG. 2A, illustrates the deleterious effects of bird's beak encroachment. As shown in FIG. 2A, FOX regions 31 may extend beneath a substantial portion of mask regions 33 near the end or terminating portion of an active area. As mentioned earlier, near the terminus of narrow features, the encroachment becomes particularly severe, often severely distorting the AA feature and causing masking stack lifting.

Unfortunately, various techniques augmenting the basic LOCOS process are often accompanied by undesirable side effects or undue process complexity. For example, in DRAM fabrication technology, conventional LOCOS processes are often scaled for smaller device dimensions by increasing the nitride thickness and reducing the pad oxide thickness to reduce the FOX encroachment. This also increases stress in the nitride as well as the underlying silicon, creating crystal defects which increase device junction leakage. On the other hand, if the nitride stack is not increased, stack lifting causes unpredictable changes in the shape of the active areas, particularly at the terminus of small features typically found in DRAM applications.

In the continuing trend toward higher density and higher performance integrated circuits, effective field isolation on a submicron scale remains one of the most difficult challenges facing current process technology. While conventional LOCOS processes have sufficed in the past, there remains a critical need for improved field isolation.

SUMMARY OF THE INVENTION

An object of the present invention is to provide a field isolation process which reduces distortion of active areas and encroachment of field isolation into such active areas. A further object of the present invention is to provide a multiple-masked isolation process for optimizing a field isolation configuration for the isolation requirements of a specific integrated circuit.

In accordance with one aspect of the present invention, a field isolation process comprises two or more isolation formation steps, each step contributing a portion of the final field isolation for a specific configuration of active areas. In a basic embodiment of the present invention, a single masking stack is successively patterned providing for the formation of two field isolation configurations. In a preferred embodiment of a dual-masked isolation process, separate masking stacks are used for each isolation process, allowing greater versatility in mask design. In the dual-mask isolation process of the present invention isolation masks are configured to reduce oxide encroachment into active areas by forming oxide islands in the silicon substrate. The superposition of multiple isolation configurations produces isolated active areas having reduced oxide encroachment.

In accordance with another aspect of the present invention, isolation requirements in different regions of an integrated circuit are achieved by a multiple mask isolation process. Each mask in such a process is comprised of composite mask portions corresponding to each region of the integrated circuit. The superposition of such isolation steps may for example form active areas bounded by a thin oxide in one region, while simultaneously forming a thicker oxide in other regions of the circuit.

These and other objects and aspects of the present invention will be made more clear with the following detailed description and accompanying figures.

BRIEF DESCRIPTION OF THE DRAWINGS

FIG. 4A is a sectional view of the first mask and field oxide from FIG. 4.

FIG. 5 is a plan view of a second mask in a dual mask field isolation process.

FIG. 5A is a sectional view of the second mask and field oxide from FIG. 5.

FIG. 6 is a partial process flow for a preferred dual mask field isolation process.

DETAILED DESCRIPTION OF THE PREFERRED EMBODIMENT

As described above, two difficult problems in conventional field isolation, particularly LOCOS processes, is rounding of active area (AA) features and large encroachment of field oxide (FOX) into such areas. In accordance with the basic principles of the present invention, these problems are mitigated by utilizing multiple-masked patterning and growth processes which minimize mask features having sharp or oblique angles and terminating features. Thus, the present invention processes allow formation of smaller active areas while minimizing field oxide encroachment.

Figure 1:
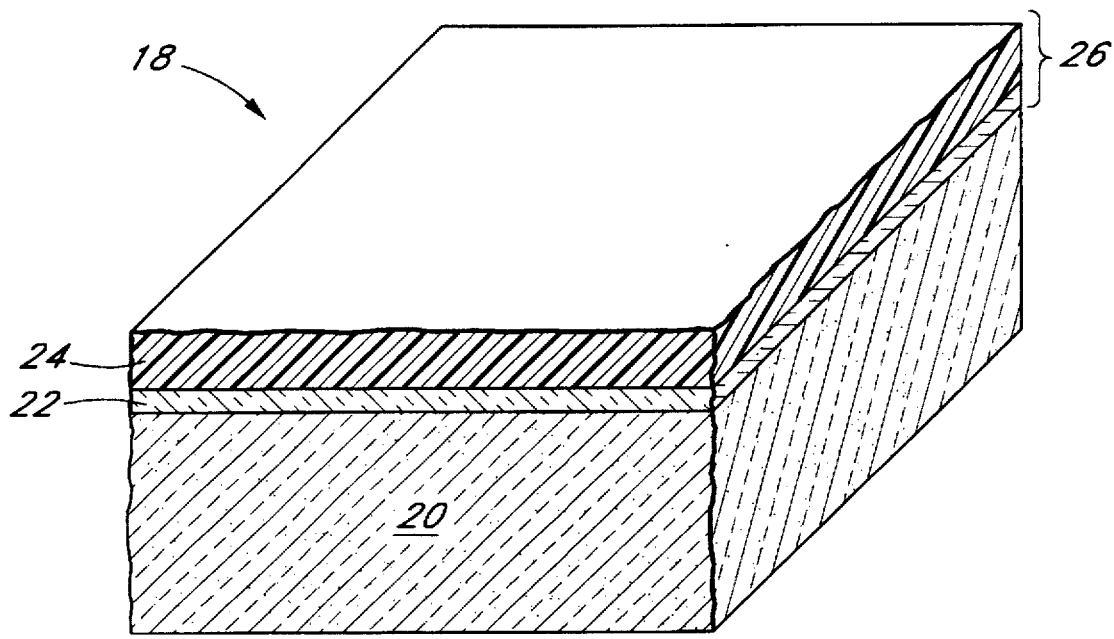
FIG. 1 is a sectional prospective of a conventional masking stack.
Figure 2:
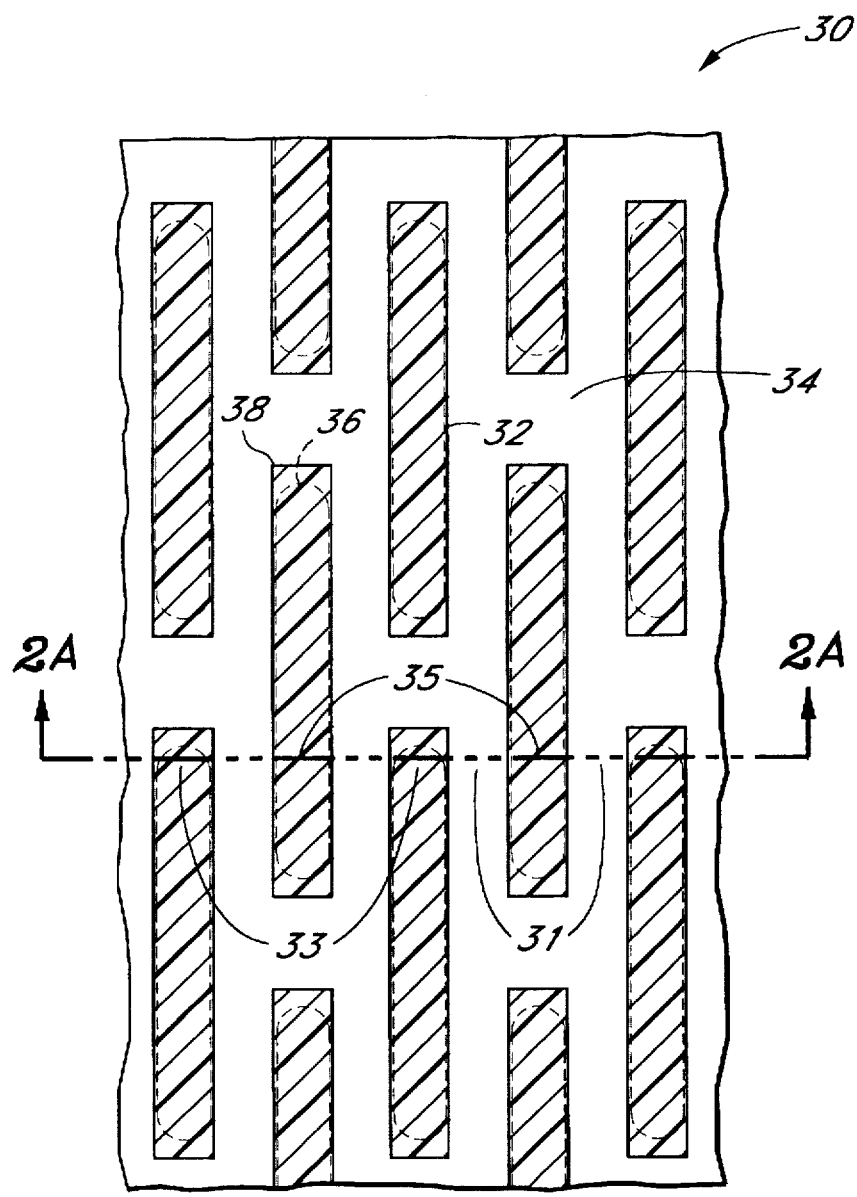
FIG. 2 is a partial plan view of an exemplary prior art mask for a field isolation array.
Figure 2A:
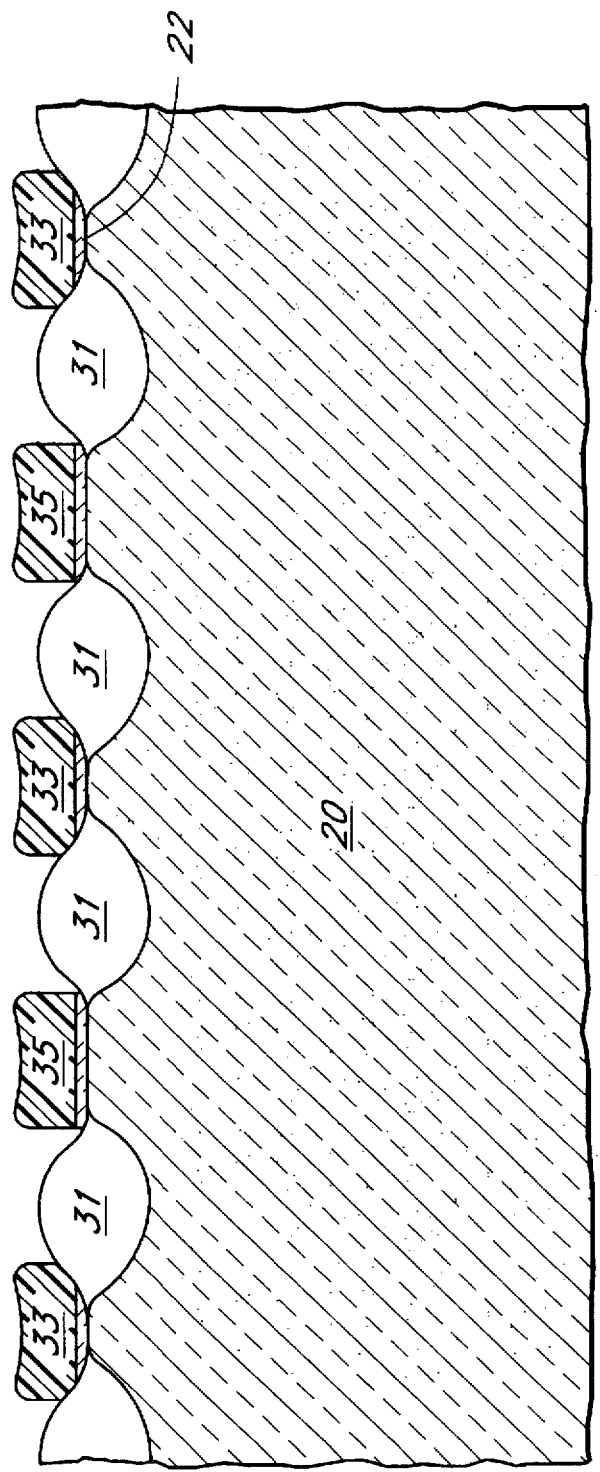
FIG. 2a is a sectional view of the mask and field isolation structure shown in FIG. 2.
Figure 3:
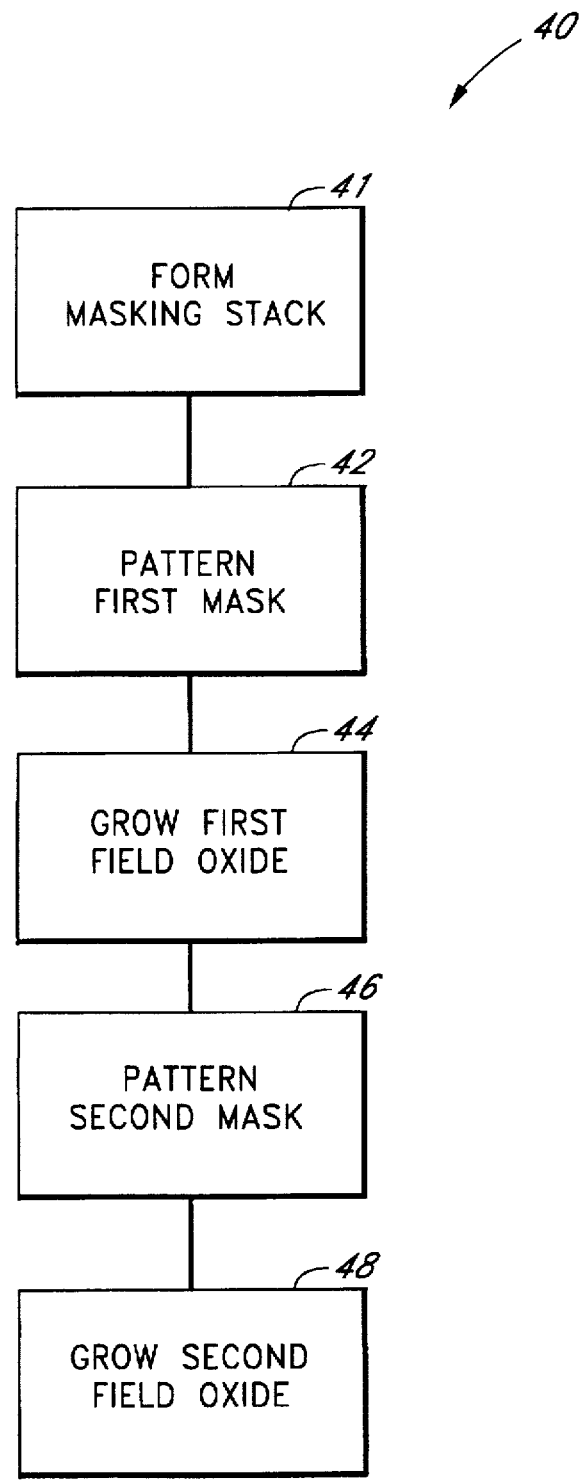
FIG. 3 is a partial process flow for a basic embodiment of the present invention.
Figure 4:
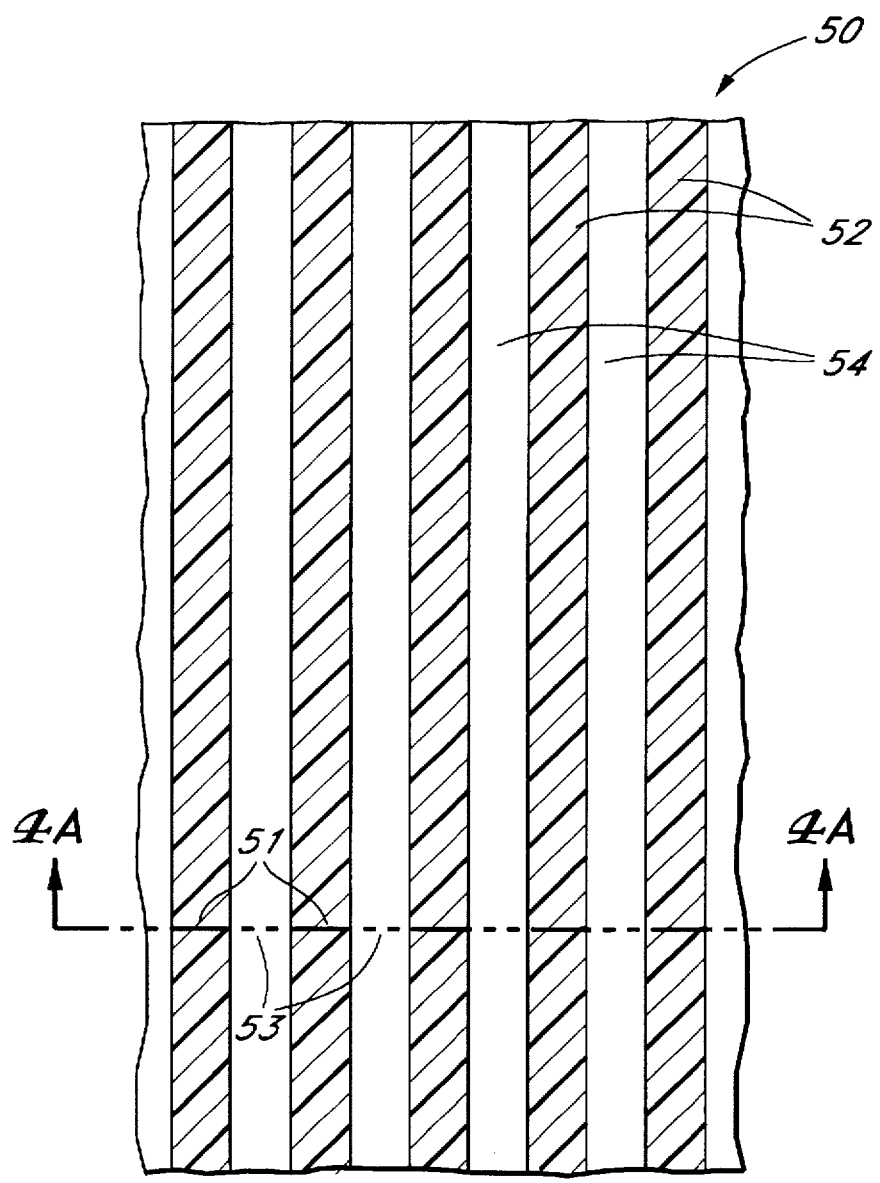
FIG. 4 is a plan view of a first mask in a dual mask field isolation process.

For example, the active area array 30 shown in FIG. 2 may be obtained by a basic embodiment of the present invention, through a process outlined in FIG. 3. As shown in FIG. 3, a first step 41 in this basic process is forming the masking stack 26 as show previously in connection with FIG. 1. After forming the masking stack 26 as indicated in process step 41, a first patterning step 42 is performed, whereby a first set of masked features is formed. The patterning step 42 may be performed in a variety of ways well known in the art. Typically, mask features are defined by photolithography processes and formed by an etching process. An example of a first mask 50 is shown in FIG. 4, where mask strips 52 are formed on substrate as a result of the first patterning process step 41. The mask strips 52 avoid terminating features which would otherwise give rise to rounding due to diffraction and interference during photolithography.

The next process step 44 is growing a first field oxide (FOX1) 53 in regions 54 not masked by strips 52 as shown in FIG. 4. Again, because the mask avoids narrow terminating active area features, bird's beak encroachment will be kept to a minimum under a given set of process parameters. As shown in section 4A, the FOX1 regions 53 will encroach minimally beneath mask regions 51 and, furthermore, provide greater uniformity in FOX1 features.

Following growth of FOX1, a second patterning step 46 (FIG. 3) forms additional features which more completely define the active area array. As shown in FIG. 5, the second patterning step 46 may open windows 56 or breaks in the masking strips 52, thereby defining terminations for the individual active areas of the array 30 (FIG. 2). In the present exemplary embodiment, the second patterning step 46 comprises a photolithographic process to define an array of rectangular windows 56 which intersect the masking strips 52 at regions 58. The patterning step further comprises an etch step to remove sections of masking stacks 51 (FIG. 4A) within the regions 58 (i.e., within regions of intersection between the masking strips 52 within and windows 56), thereby introducing a gap between collinear active areas. The windows 56 themselves terminate on intervening FOX1 regions 54, which eliminates alignment error in the lithography process and does not introduce narrow terminating features.

Following the second patterning step 46, a second field oxide growth 48 (FIG. 3) is performed. The second field oxidation step 48 grows a second layer of field oxide FOX2 in unmasked regions 54 and 58 (FIG. 5), thereby completing active area isolation. In the present embodiment, bird's beak encroachment into the active areas adjacent to the newly unmasked regions 58 is minimized due to the restricted active area edge which limits oxygen diffusion. In contrast to prior art methods, the two-step patterning and oxidation process result in regions having different thicknesses of field oxide. In particular, regions 58 bounded by the edges of masking strips 52 and windows 56 have been exposed to only the second field oxidation step 48 and, therefore, have only FOX2 residing within these boundaries. On the other hand, regions 54 between masking strips 52 have been exposed to both field oxidation steps 44 and 48, and therefore a thicker field oxide (FOX1 and FOX2, superimposed to produce FOX12) grows in these regions 54.

FIG. 5A is a cross-section taken along lines 5A—5A of FIG. 5, showing the field oxide grown within the regions defined above. Stack sections 51 represent masked sections of the substrate, and therefore are substantially free of oxide growth. FOX2 sections 57 represent the oxide growth in regions 58 (FIG. 5) which were exposed to only the second oxidation 48, while FOX12 sections 59 represent the oxide growth in regions 54, exposed to both oxidations and therefore including both FOX1 and FOX2. The FOX12 sections 59 are thicker than sections 57. The present embodiment of a dual-mask field isolation presents several advantages over conventional single masked processes. Rounding and reduction of active area features during photolithography is reduced by substantially eliminating narrow terminating features, sharp corners and oblique angles in masked features. Field oxide encroachment is also reduced by avoiding oxide growth around oblique angles which would otherwise present a large perimeter for oxygen diffusion. Furthermore, the dual-mask features are arranged to minimize mask alignment tolerance.

An added benefit of the present dual-mask approach is that the FOX thickness may be varied in accordance with the demands of active area isolation. For example, in the present active area array, the FOX12 sections 59 shown in FIG. 5A isolate the long sides of the active areas, which may be more susceptible to potential leakage between adjacent active areas. Less isolation is required of FOX2 sections 57 between short sides of the active areas. Thus, adequate field oxide isolation is maintained while minimizing bird's beak encroachment.

In accordance with a preferred embodiment of the present invention, an improved field isolation process utilizes a new masking stack in conjunction with each patterning step, generally illustrated by FIGS. 6 to 9. As shown in FIG. 6, a partial process flow of a preferred dual-mask field isolation process comprises two masking stack formations with corresponding patterning and oxide growth steps. In particular, the process shown in FIG. 6 begins with the step 61 of forming a first masking stack, as previously described in connection with FIG. 1. Further, the first masking stack is patterned and etched in a first patterning step 62 and, subsequently, a first field oxidation step 63 is performed. The first patterning step 62 will provide a first mask having mask features advantageous for the first field oxide growth 63 which preferably minimizes oxide encroachment into active areas.

Figure 7:
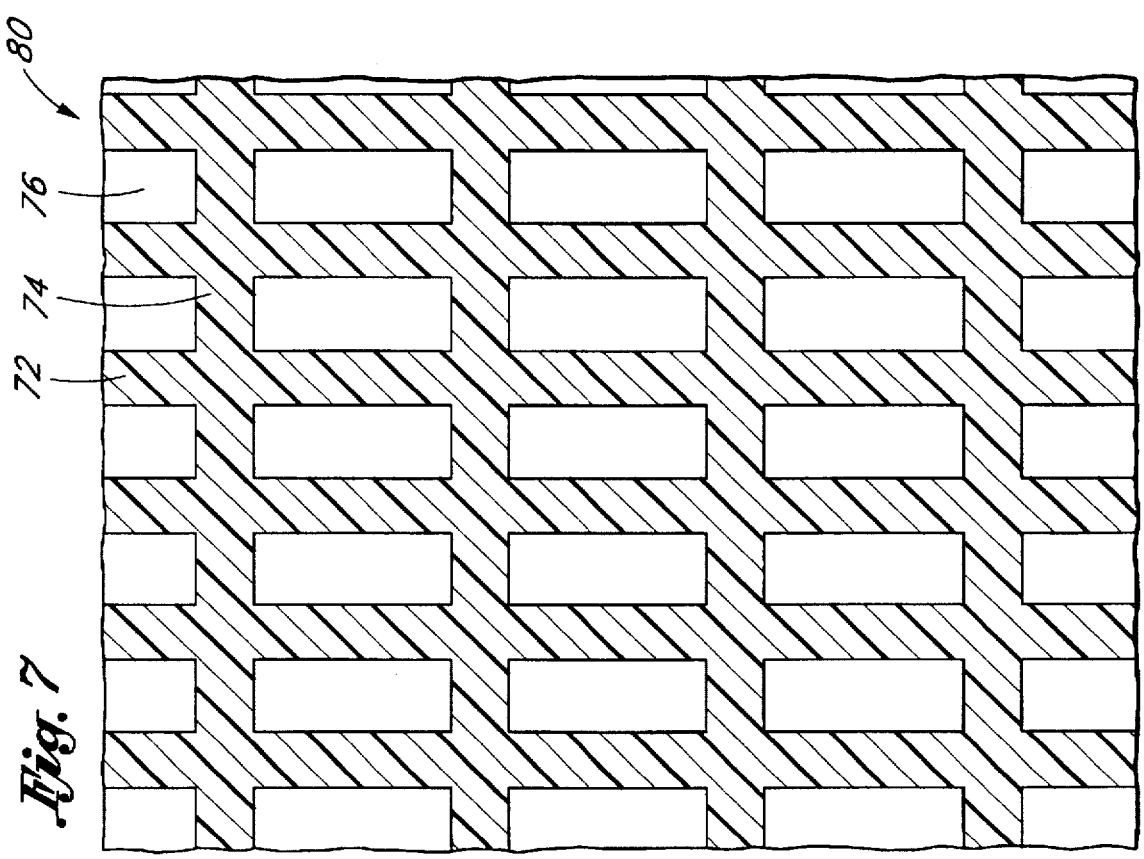
FIG. 7 is a plan view of a first mask used in a preferred field isolation process.

FIG. 7 illustrates a specific example of a first mask used in route to producing an active area array similar to that of FIG. 2. This first FOX mask 80 comprises an interconnected net of masking strips 72 and 74 which allow a first field oxide to grow in island regions 76 defined by the mask 80. The oxide islands 76 will tend to exhibit less encroachment into mask regions 72, 74. Furthermore, the net-like structure formed by interconnected sections 72 and 74 will tend to reduce stack lifting common with small masked features. Subsequent to the first field oxidation 63, the first mask 80 is removed, as indicated in process step 64 (FIG. 6). For example, the mask 80 may be removed by conventional etching process, leaving the first field oxidation, in this case comprising oxide islands 76.

Figure 8:
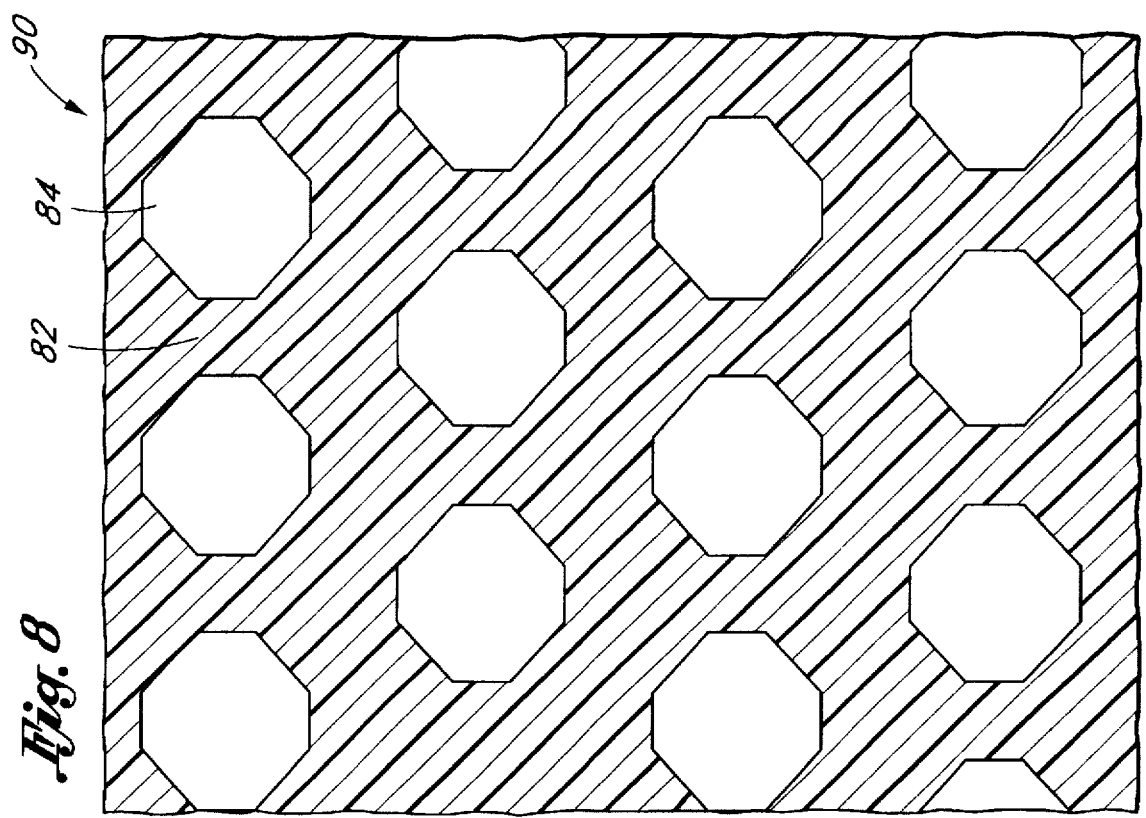
FIG. 8 is a plan view of a second mask used in a preferred field isolation process.

Thereafter, a second masking stack is formed on the wafer as shown in the process step 65 (FIG. 6). A second patterning step is performed as shown in step 66 which is followed by a second field oxidation step 67. Again, the advantageous aspects of the second masking and patterning steps 65 and 66 should preferably provide features which minimize encroachment during the second field oxidation step 67. For example, a preferred second mask 90 would provide field oxide islands enmeshed in a matrix of mask material, as shown in FIG. 8. In FIG. 8, as in FIG. 7, a second field oxide is grown in regions 84 which are bounded by mask regions 82. The mask region 82 forms an interconnected mesh which resists stack lifting as previously mentioned in connection with FIG. 7. Furthermore, oxidation in regions 84 occurs with minimal encroachment into regions 82.

Figure 9:
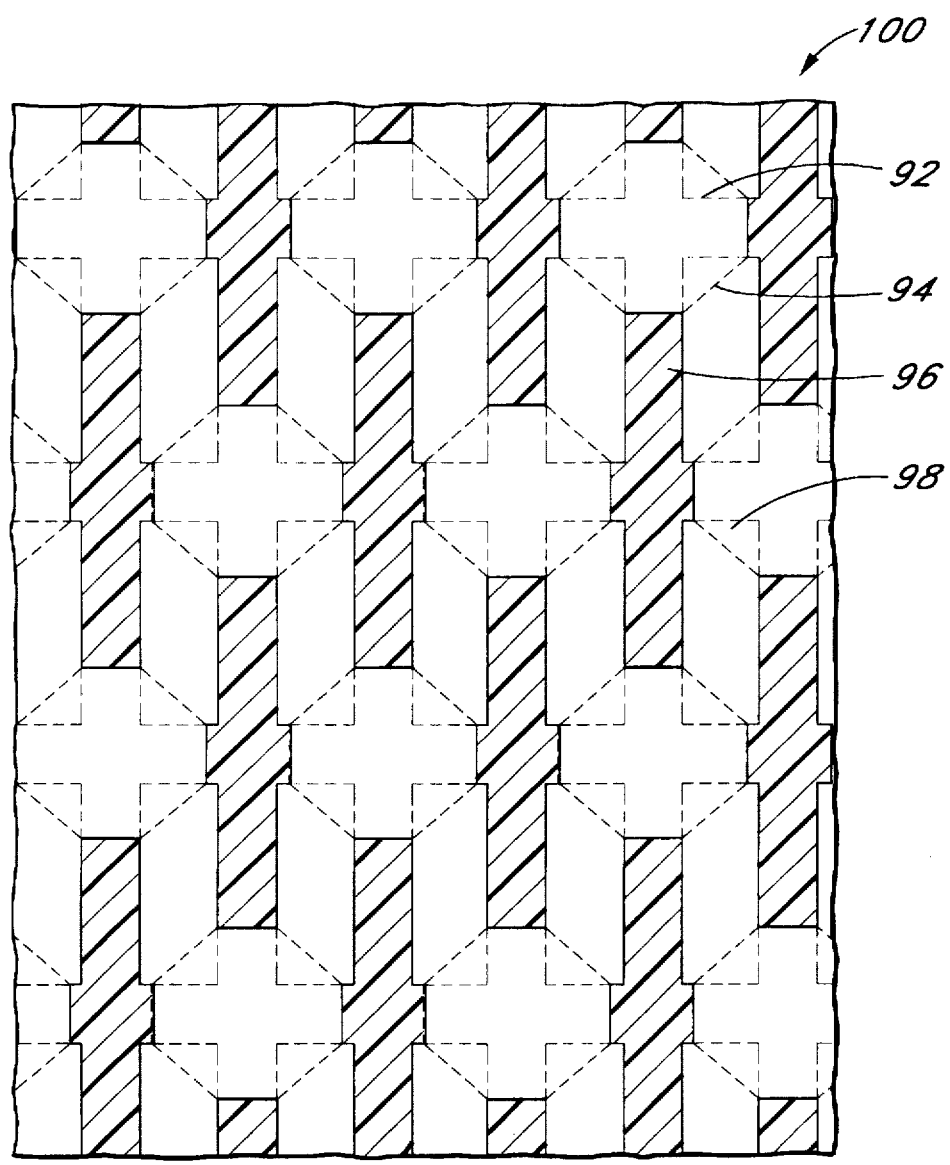
FIG. 9 is a superposition of the two masks shown in FIGS. 7 and 8.

The combination of masking/patterning/oxidation steps, outlined in FIG. 6 and illustrated in FIGS. 7 and 8, produces the active area array 100 as shown in FIG. 9. The combination of the two oxidation masks 80 and 90, shown in connection with FIGS. 7 and 8, are reproduced in registration (92, 94) showing the resulting active area features 96 surrounded by field oxide. In this preferred embodiment of an isolation process, the field oxide adjacent to the active areas is derived either from the first field oxidation step 63 or from the second field oxidation step 67. Thus, FOX thickness may be adjusted for specific active area isolation needs.

It will be appreciated that the present dual-mask embodiment may take a variety of forms dictated by the isolation needs of a given circuit arrangement. In general, however, it is most preferable for each mask of a multi-mask isolation process to grow field oxide regions shaped so as to minimize encroachment into active regions. For example, by growing FOX islands surrounded by simply connected mask regions, field oxide encroachment is held to a minimum for given process conditions. The desired active area regions are thus formed by the superposition of such FOX growth steps.

It is often the case that integrated circuit designs place the smallest active area features in the interior portion of the chip die while having larger, higher voltage components in the periphery regions. For example, it is advantageous to have memory or gate arrays requiring lower voltage in the die interior while having input/output devices requiring higher voltage disposed on the array periphery. The present multi-mask isolation process allows for the simultaneous formation of both the array and periphery field oxide by arranging features on each mask, such as to form a thin FOX in the array and, at the same time, forming a thicker FOX in the periphery.

Figure 10:
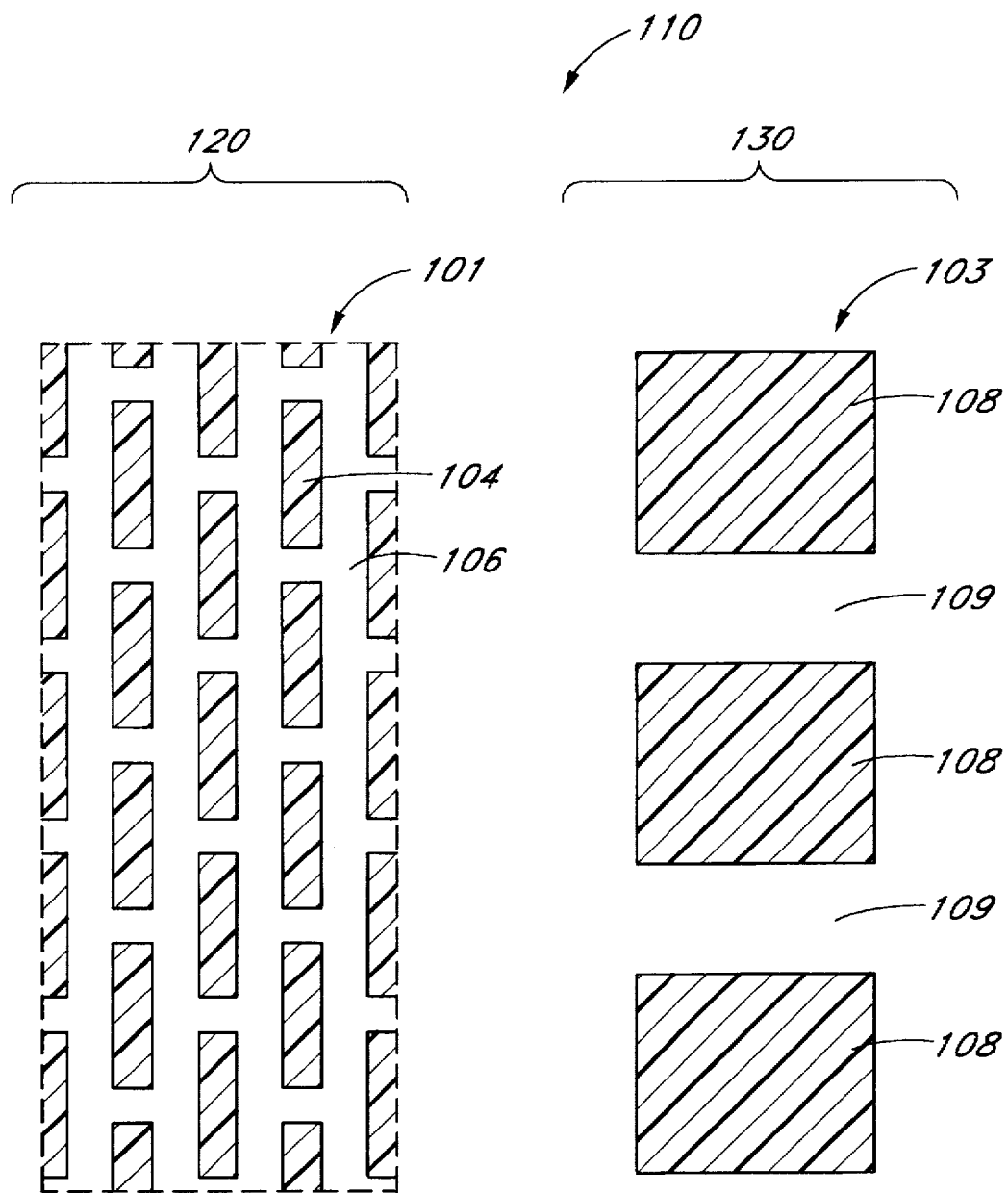
FIG. 10 is a plan view of a composite mask used in a preferred dual mask field isolation process.

For example, a schematic mask arrangement 110 shown in FIG. 10 may include an array region 120 comprising an array mask portion 101 having small active area features 104 suitable for memory or gate arrays. The mask arrangement 110 also comprises a periphery region 130 comprising a periphery mask portion 103 having larger active area features 108 suitable for input/output devices and the like. In such circumstances, it is often desirable to have the array FOX 106 in the array regions 120 thinner than the periphery FOX 109 in order to reliably form the small active areas 104 as well as minimizing oxide encroachment into such areas. It will also be appreciated that a thicker oxide periphery FOX 109 is desirable because of generally higher operating voltages designed for the periphery devices.

Figure 11:
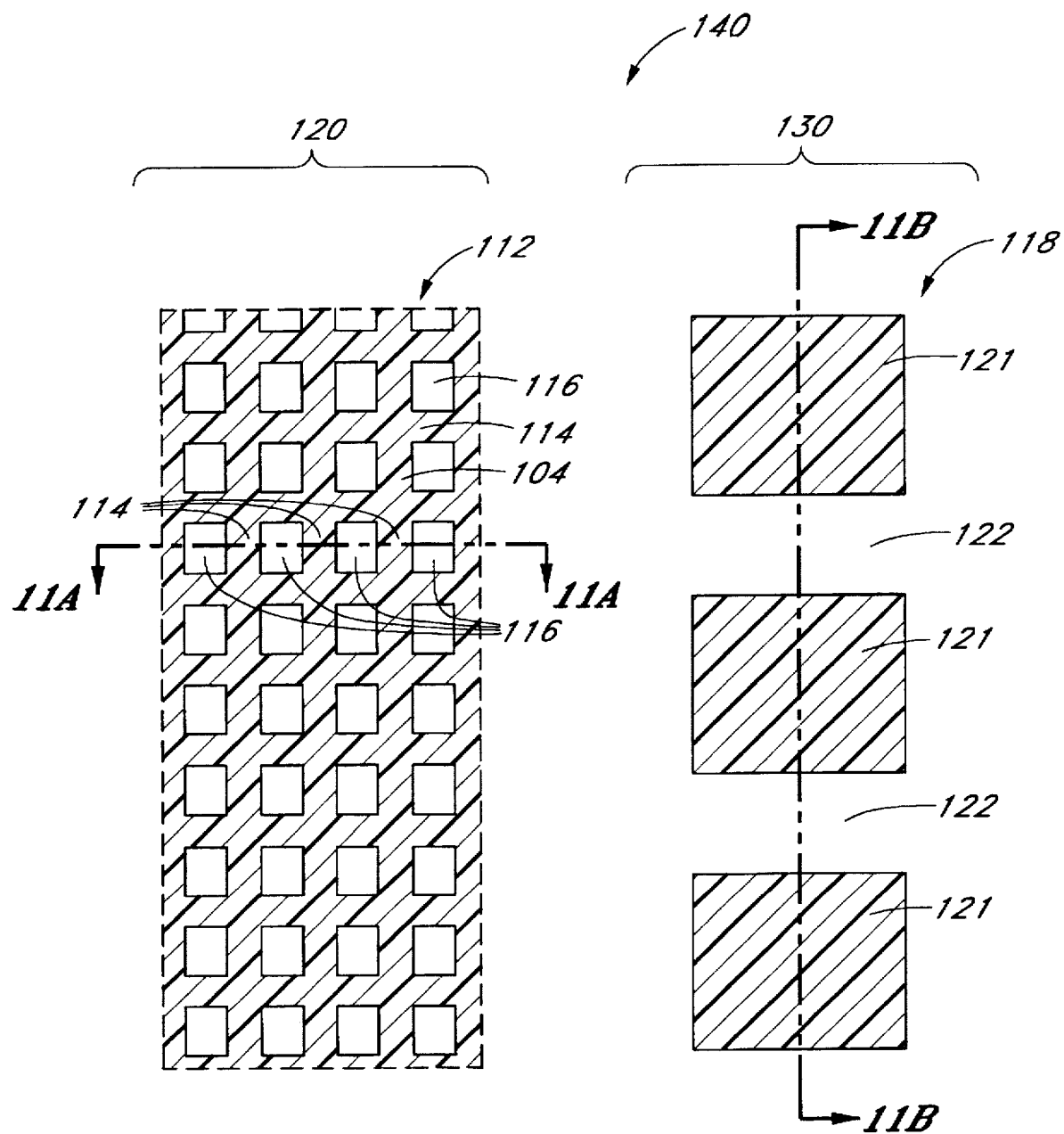
FIG. 11 is a plan view of a first composite mask used in a preferred field isolation process.
Figure 11A:
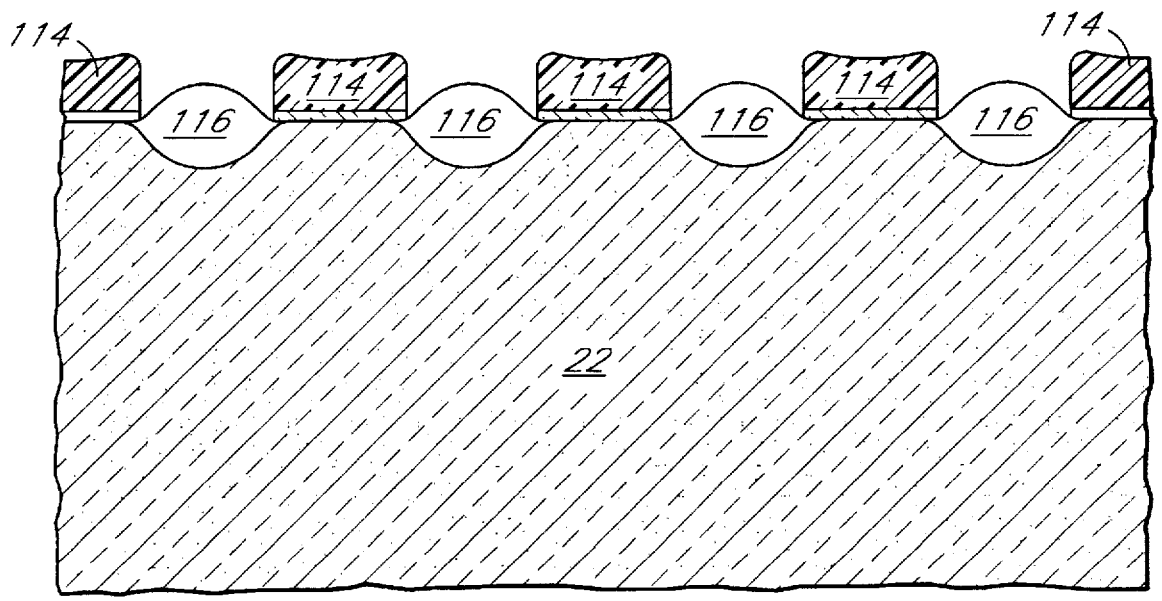
FIG. 11A is a sectional view of the array portion shown in FIG. 11.
Figure 11B:
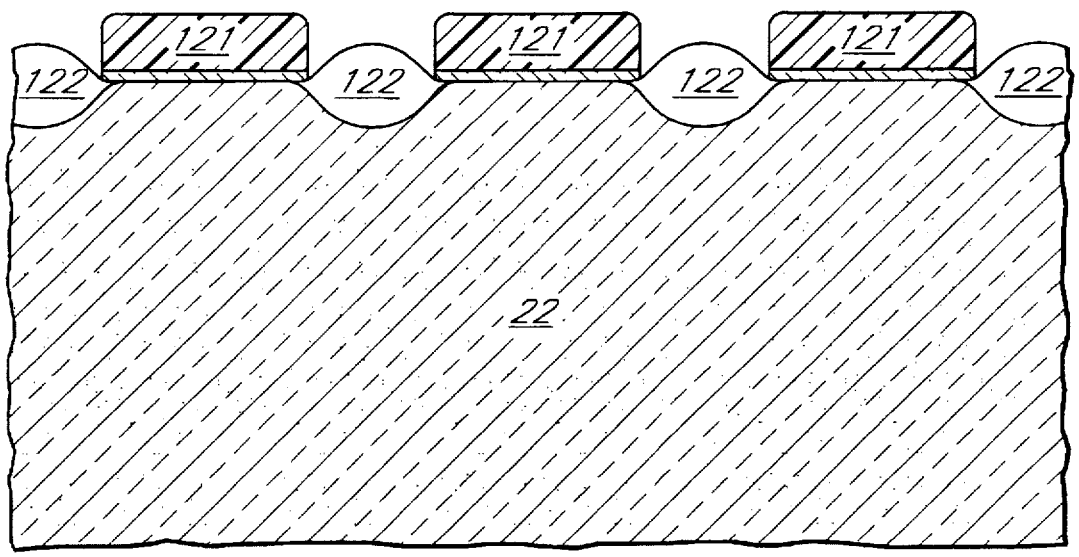
FIG. 11B is a sectional view of the periphery portion shown in FIG. 11.
Figure 12:
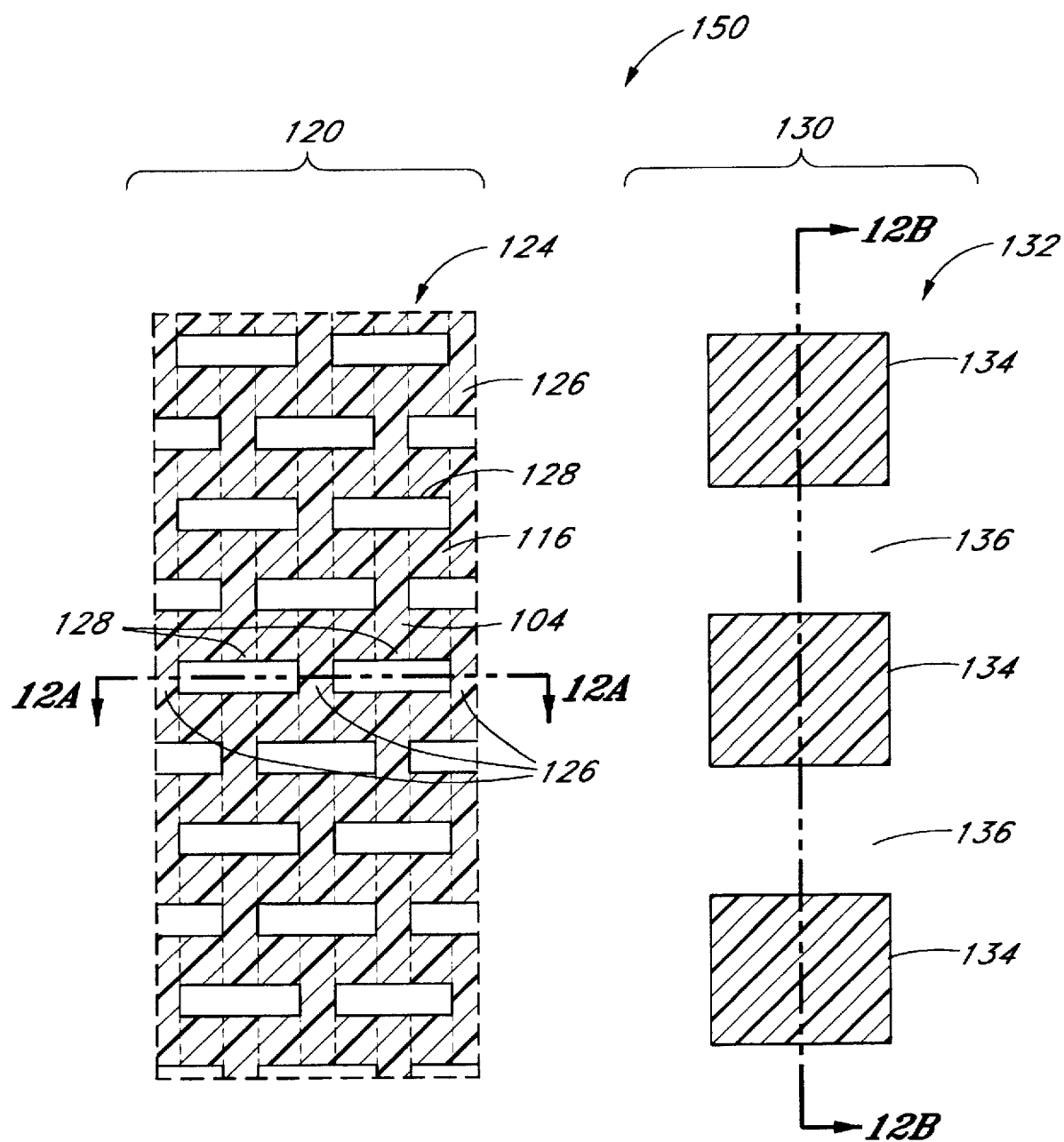
FIG. 12 is a plan view of a second composite mask used in a preferred field isolation process.
Figure 12A:
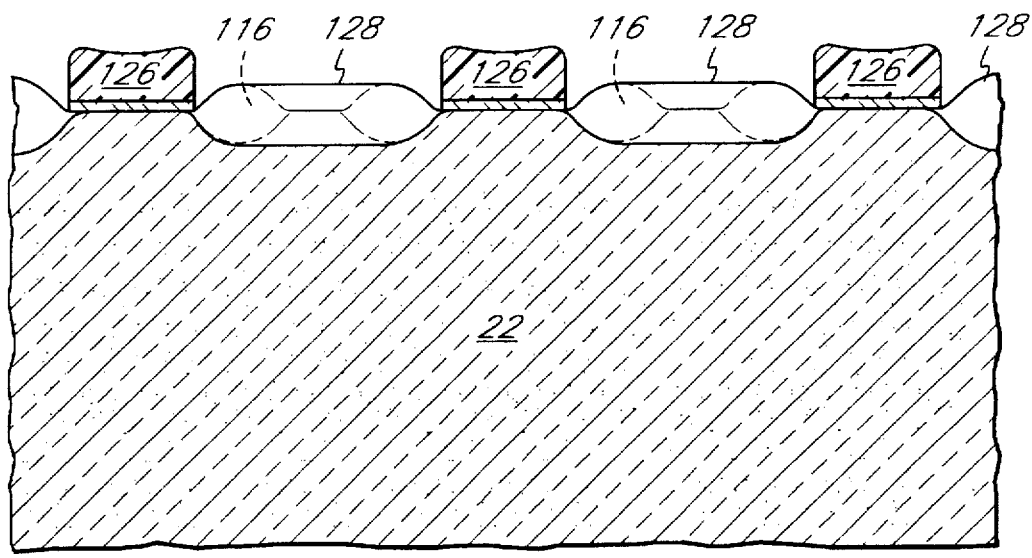
FIG. 12A is a sectional view of the array portion shown in FIG. 12.
Figure 12B:
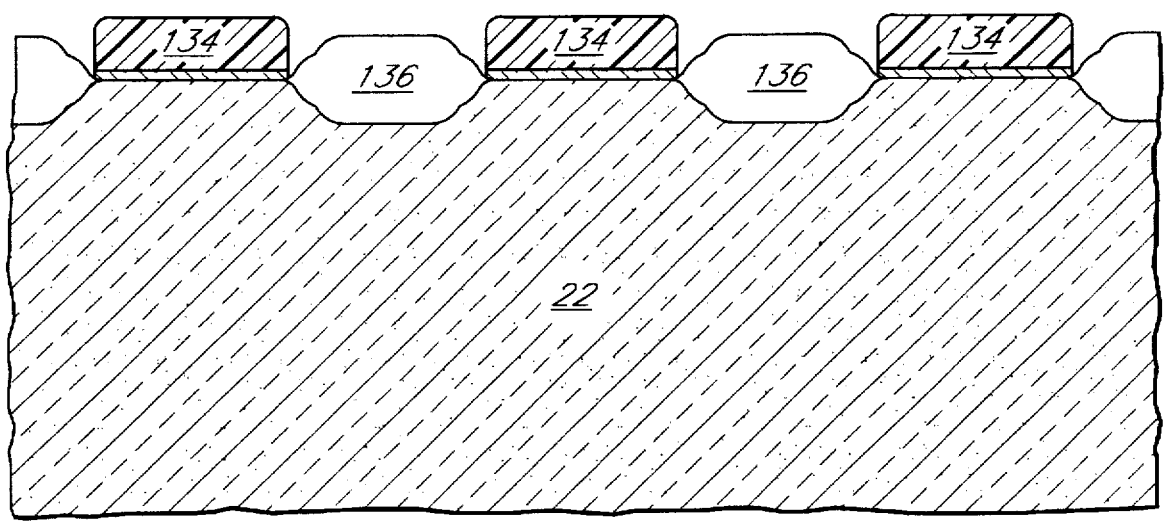
FIG. 12B is a sectional view of the periphery portion shown in FIG. 12.

Another preferred embodiment of the present invention, illustrated generally by FIGS. 11 to 12B, allows for the efficient formation of both array regions 120 and periphery regions 130 of FIG. 10 by a dual-mask process which, for example, grows a superposition of FOX islands in the array region 120 while simultaneously forming active area islands in the periphery region 130. As shown in FIG. 11, a first composite mask 140 of the present dual-mask process comprises a first array portion. As shown in FIG. 11, a first array mask 112 located in the array region 120 comprises interconnected mask sections 114 which define oxide regions 116 within which field oxide islands are grown. The periphery region 130 comprises a first periphery mask 118 having periphery mask sections 121 which correspond substantially to the active areas desired for the periphery region 130. A first field oxidation step using the mask of FIG. 11 forms oxide islands in the region 120 while forming active area islands in the region 130. FIGS. 11A and 11B show exemplary sections through the array and periphery mask portions (112 and 118) after the first field oxidation. The field oxide sections 116 of FIG. 11 show minimal encroachment beneath mask sections 114 because these oxide regions are grown as islands bounded by interconnected mask sections. On the other hand, conventional design rules may be used in the periphery region 130 to produce the section shown in FIG. 11B. As will be appreciated, a greater degree of field oxide encroachment may be tolerated in the periphery region. It is therefore anticipated that conventional design rules may be utilized to simplify mask design.

Following the first mask and field oxidation steps, the first mask may be modified to form a second mask or removed and a second mask formed from a second masking stack.

A second mask 150 used in the present embodiment is shown in FIG. 12 comprising array and periphery mask portions 124 and 132 corresponding to the array region 120 and the periphery region 130, respectively. The second array mask 124 complements the first array mask 112 shown in connection with the first mask of FIG. 11. The second array mask 124 comprises mask regions 126 which define regions of oxide formation (128) which are substantially adjacent to the oxide regions (116) formed using the first array mask 112. Specifically, the orientation and registration between the array masks 112 and 124 shown in FIGS. 11 and 12 define the active area features 104 desirable for the array region 120 while minimizing oxide encroachment into the array active areas.

Similarly, the periphery mask 103 shown in the periphery region 130 of FIG. 10 is formed by the superposition of a first periphery mask 118 and second periphery mask 132. In the present embodiment, the second periphery mask 132 substantially overlays the first periphery mask 118. Thus, field oxide is formed in substantially the same features for both field oxidation steps. The resulting FOX in the periphery region 130 will be thicker than the FOX in the array region 120. Preferably, one of the two periphery masks 132 or 118 should comprise features which are slightly dilated in size with respect to the complementary mask, thereby forming active area boundaries defined by a single oxide formulation step. This will reduce oxide encroachment into the periphery active areas while providing thick FOX isolation in the intervening periphery regions.

The sections shown in FIGS. 12A and 12B illustrate the resulting field oxide profiles for the present embodiment of a dual-masked isolation process. As shown in FIG. 12A, field oxide islands 128 are bounded by mask portions 126, a configuration which reduces oxide encroachment. Also shown are the first field oxide islands 116 from the first field oxidation step. As indicated in the section 12A, the first field oxide islands 116 and the second field oxide islands 128 are formed adjacent to each other and contiguous to define the desired active areas 104 (FIG. 12).

As shown in FIG. 12B, the periphery field oxide 136 comprises oxide formed from both of the oxidation steps. Thus, the periphery field oxide 136 is thicker than the array field oxide 128 and 116 to allow for greater active area isolation. Additionally, as noted previously, the first and second periphery mask portions 121 and 134 are sized differently so that any field oxide encroachment into the active areas results from only a single oxidation step. Thus, the relative degree of encroachment is reduced while still providing a field oxide thick enough for typical periphery devices.

Thus, in accordance with the principles of the present invention, a composite (array and periphery) dual-mask field isolation process produces active area features having reduced distortion or encroachment from surrounding field oxide. The present preferred embodiment illustrates that these principles may be satisfied by utilizing dual composite masks having different design rules for the array and periphery portions. In particular, the array portions of the dual-mask process form field oxide islands adjacent and contiguous to define the desired array active areas. On the other hand, the periphery portions of the dual-mask process form a thicker field oxide by superimposing two masks in registration. Preferably, the two periphery masks are sized differently to produce active areas defined by a single oxidation step.

Although the foregoing invention has been described in terms of a preferred embodiment, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

What is claimed is:

1. A field isolation process for defining a plurality of active area island regions within a semiconiductor substrate, the process comprising the steps of:

forming a first field isolation mask defining a plurality of non-contiguous first field isolation regions;

performing a first field oxidation forming a first field oxide within the first field isolation regions;

forming a second field isolation mask defining a plurality of second field isolation regions; and performing a second field oxidation forming a second field oxide within the second field isolation regions, the first and second field isolation regions overlapping to surround and define the active area islands.

2. The field isolation process of claim 1, wherein the second field isolation regions are non-contiguous.

3. The field isolation process of claim 1, wherein the step of forming the second field isolation mask comprises modifying the first field isolation mask subsequent to the first field oxidation.

4. The field isolation process of claim 1, further comprising the step of removing the first field isolation mask subsequent to forming the first field oxide and prior to forming the second field isolation mask.

5. A method of electrically isolating a plurality of active regions on a semiconductor substrate, the method comprising:

forming a first mask on the substrate, the first mask defining a plurality of non-contiguous first openings;

forming a second mask on the substrate, the second mask defining a plurality of second openings;

growing a first field oxide in said first openings and a second field oxide in said second openings, the first and second field oxides together surrounding and defining the isolated active areas.

6. The method of claim 5, wherein the second openings are non-contiguous.

7. The method of claim 5, wherein the first mask is formed prior to forming the second mask.

8. The method of claim 7, further comprising removing the first mask prior to forming the second mask.

* * * * *

UNITED STATES PATENT AND TRADEMARK OFFICE
CERTIFICATE OF CORRECTION

PATENT NO. : 5,789,306
DATED : August 4, 1998
INVENTOR(S) : Roberts, et. al.

It is certified that error appears in the above-identified patent and that said Letters Patent is hereby corrected as shown below:

Column 8, line, claim 1, replace "semiconiductor" with "semiconductor"

Signed and Sealed this

Fourteenth Day of December, 1999

Attest:

Attesting Officer

Q. TODD DICKINSON

Acting Commissioner of Patents and Trademarks